(12) United States Patent
Flannagan

(10) Patent No.: US 6,473,349 B1
(45) Date of Patent: Oct. 29, 2002

(54) CASCODE SENSE AMP AND COLUMN SELECT CIRCUIT AND METHOD OF OPERATION

(75) Inventor: Stephen T. Flannagan, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/997,330

(22) Filed: Nov. 29, 2001

(51) Int. Cl.[7] .................................................. G11C 7/00
(52) U.S. Cl. .................... 365/205; 365/207; 365/230.08
(58) Field of Search ................................. 365/205, 207, 365/203, 189.05, 230.08, 189.02; 327/51

(56) References Cited

U.S. PATENT DOCUMENTS

| | | | |
|---|---|---|---|
| 4,658,160 A | 4/1987 | Young | |
| 4,677,592 A | 6/1987 | Sakurai et al. | |
| 4,796,230 A | 1/1989 | Young | |
| 4,888,503 A | 12/1989 | Young | |
| 5,023,841 A | 6/1991 | Akrout et al. | |
| 5,247,479 A | 9/1993 | Young | |
| 5,384,503 A | 1/1995 | Shu et al. | |
| 5,650,971 A | * 7/1997 | Longway et al. | ............. 327/51 |
| 5,815,452 A | 9/1998 | Shen | |
| 6,327,203 B1 | * 12/2001 | Won | ...................... 365/189.07 |

OTHER PUBLICATIONS

Evert Seevinck et al., "Current–Mode Techniques for High–Speed VLSI Circuits with Application to Current Sense Amplifier for CMOS SRAM's", 1991 IEEE journal of Solid–State Circuits, vol. 26, No. 4, Apr., 1991, pp. 525–536.

* cited by examiner

Primary Examiner—David Lam
(74) Attorney, Agent, or Firm—Robert L. King

(57) ABSTRACT

A sense amplifier uses a cascode stage (76 or 100) that receives a predetermined bit line pair differential signal and provides an output. The cascode stage output is coupled to a true and a complement output of the sense amplifier. In one form, a pair of pass transistors (77, 78) and an amplifier (79) are coupled to the cascode stage and to complementary outputs and are controlled by a sense enable signal. The amplifier is operative only when the pair of pass transistors are made nonconductive. In another form, the cascode stage is connected directly to a bit line pair differential signal and to sense nodes (82, 86) that are separately coupled to a data line pair by a coupler (102) and an amplifier (104).

17 Claims, 4 Drawing Sheets

US 6,473,349 B1

CASCODE SENSE AMP AND COLUMN SELECT CIRCUIT AND METHOD OF OPERATION

FIELD OF THE INVENTION

This invention relates generally to semiconductor memories, and more specifically, to sense amplifiers used in semiconductor memories.

BACKGROUND OF THE INVENTION

Sense amplifiers are used in conjunction with memories such as a static random access memory array (SRAM). Sense amplifiers function to detect when complementary bit lines in a memory array exhibit a voltage transition in response to column and row decoding and a sense enable signal. In an SRAM, there is a need to amplify and decode signals provided via columns of memory cells. Transistor pass gates are frequently used to perform column decoding. However, the amplification and decoding of such signals needs to be done with minimized ohmic losses in transistor pass gates. A static RAM bit line differential bit line signal develops in a manner that increases with time. Hence, whenever a differential signal is conducted by a pass gate, there is detriment to the differential signal that may be characterized in terms of either a time delay or a reduction in its magnitude. In the art, these two characterizations are often referred to as an RC (resistance multiplied by capacitance) time delay or an RC delay. Pass devices for connecting bit lines to data lines tend to delay the passage of a differential signal due to the RC time constant. There is typically a trade between improving the timeliness or magnitude of bit line and data line signal levels versus device count and amplifier reliability. In general, amplifier reliability refers to the collective ability of all amplifiers in a memory to guarantee an accurate signal given known offsets and error voltages.

An objective of memory sense amplifiers is to avoid drawing excess charge from a bit line subsequent to clocking the sense amplifier. One technique to accomplish this objective is to use a cascode pair of transistors directly connected to the bit lines. A disadvantage of the cascode pair of transistors is that the cascode pair delivers a fairly small signal, as compared with the full $V_{CC}$ power supply value, to the local data lines. As a result, driving a global data line with the small signal is problematic. Another technique to accomplish this objective is to turn off the column decoders subsequent to the clocking of the sense amplifier, and thereby avoid pulling current from the bit lines. This technique adds circuit complexity and timing criticality to the design.

It is desirable to sense a data signal with an amplifier containing a cross-differential coupled pair of transistors. The timing of turn-on of the sense amplifier is critical. One measure of a sense amplifier's quality is the minimum differential signal that the sense amplifier is able to accurately sense. An objective in sense amplifier design is to provide the maximum differential signal to the difference in gate-to-source drive (delta $V_{GS}$) of the differential cross-coupled pair. Another critical design parameter associated with sense amplifiers is associated with the operation of a differential cross-coupled pair of transistors. The design parameter involves insuring that the difference in gate-to-source drives is greater than zero at the time the pair is clocked. If not, the output signal may not be accurate. In general, prior sense amplifiers have involved a trade-off between speed, size and power consumption.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
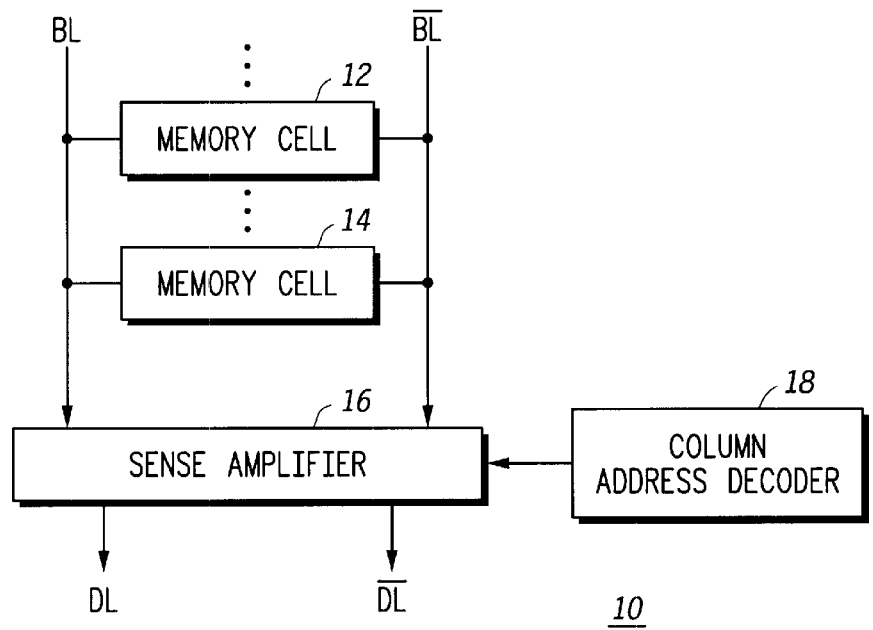
FIG. 1 illustrates in partial schematic diagram form a memory having a sense amplifier for use with the present invention.

FIG. 1 illustrates a memory 10 in which the various embodiments of the sense amplifier disclosed herein may be utilized. The memory 10 has a plurality of memory cells, such as memory cell 12 and memory cell 14. Each memory cell is connected between a bit line, BL, and a complementary bit line BL-bar. A predetermined memory cell is addressed using a row decoder (not shown) and the corresponding stored data value within the addressed memory cell is provided to a sense amplifier 16. Sense amplifier 16 functions to amplify the signal value of the data and provide a corresponding data output via data line output DL and the complement data line DL-bar. A column address decoder 18 is connected to sense amplifier 16 and functions to select the column in which memory cells 12 and 14 reside in response to a column address. It should be appreciated that the column address decode action may be performed either upstream or downstream from the sense amplifier 16, or it may alternatively be embodied within the sense amplifier 16.

Figure 2:
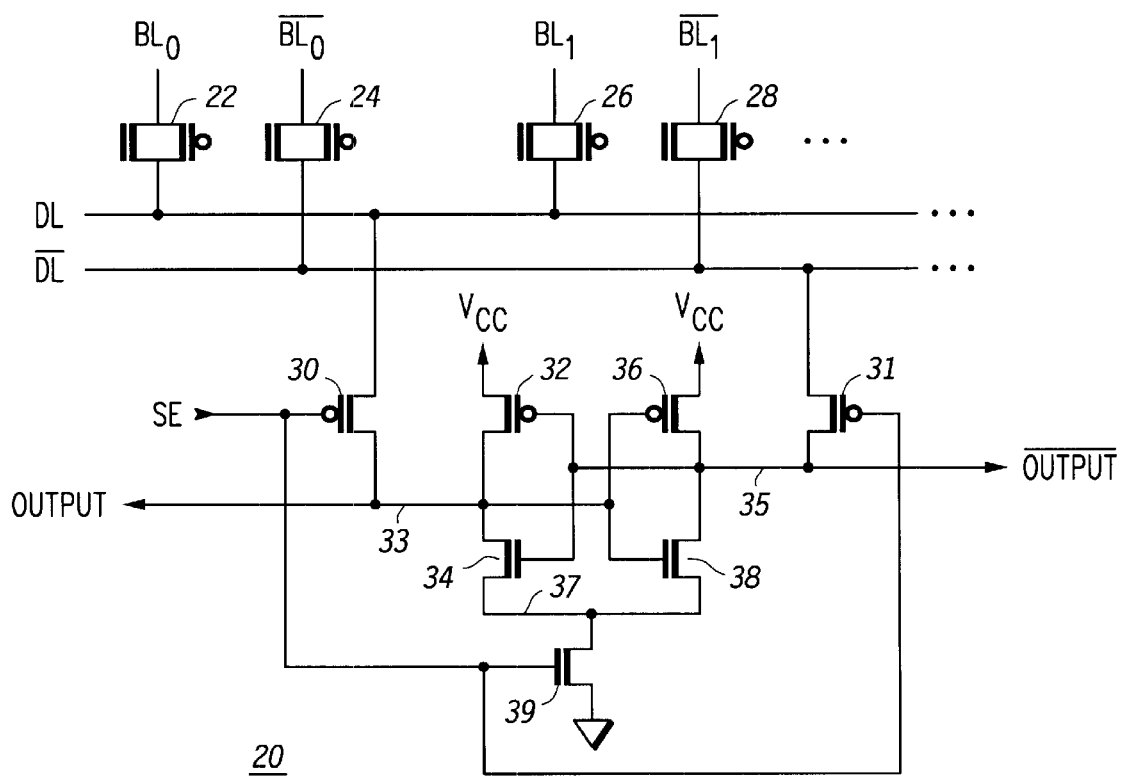
FIG. 2 illustrates in schematic diagram form of a sense amplifier in accordance with the present invention.

Illustrated in FIG. 2 is a sense amplifier 20 having a plurality of multiplexing pass gate pairs such as pass gates 22, 24 and 26, 28, etc. Each pass gate pair has one pass gate connected to the data line, DL, and one pass gate connected to the complement data line, DL-bar. Pass gate 22 has a first terminal connected to bit line BL0, and a second terminal connected to the data line DL. Pass gate 24 has a first terminal connected to the complement bit line, BL0-bar, and a second terminal connected to the complement data line, DL-bar. Pass gate 26 has a first terminal connected to the bit line BL1 and a second terminal connected to the data line DL. Pass gate 28 has a first terminal connected to the complement bit line BL1 and a second terminal connected to the complement data line. For convenience of illustration, the control signals that are connected to true and complement control terminals of each of pass gates 22, 24, 26 and 28 are not illustrated and are conventional. It should be well understood that additional pass gates exist, but are not shown for convenience of illustration. In one form, a pass gate pair exists for each column in a memory in which sense amplifier 20 is used. A first terminal of a P-channel transistor pass gate 30 is connected to the data line DL. A control terminal of P-channel transistor pass gate 30 is connected to a Sense Enable signal, SE. A second terminal of P-channel transistor pass gate 30 is connected to an Output terminal at a node 33. A source of a P-channel transistor 32 is connected to a power supply terminal $V_{CC}$. A drain of P-channel transistor 32 is connected to output terminal 33 and to a drain of an N-channel transistor 34. A gate of P-channel transistor 32 is connected to a gate of N-channel transistor 34 at a node 35 that forms a complement Output terminal. A source of N-channel transistor 34 is connected to a node 37. A source of a P-channel transistor 36 is connected to the $V_{CC}$ power supply terminal. A drain of P-channel transistor 36 is connected to a drain of an N-channel transistor 38 at node 35. A gate of P-channel transistor 36 is connected to a gate of N-channel transistor 38 at node 33. A source of N-channel transistor 38 is connected to node 37. A first terminal of a P-channel transistor pass gate 31 is connected to the complementary data line. P-channel transistor pass gate 31 has a control terminal connected to the Sense Enable signal and a second terminal connected to node 35. An N-channel transistor 39 has a drain connected to node 37, a gate connected to the Sense Enable signal, and a source connected to a ground terminal.

In operation, a signal from a memory cell (not shown) is applied to one of the bit line pairs, such as BL0, BL0-bar, etc. The multiplexing pass gates 22, 24, 26, 28, etc. can be turned on either before, during or after the information signal is applied to the bit line. The information signal then appears on the data line pair and is transmitted through pass gates 30 and 31 and arrives on nodes 33 and 35, respectively. When the signal SE is asserted, pass gates 30 and 31 are turned off. Transistor 39 is turned on when signal SE is asserted. Because the transistor pair formed by transistors 34 and 38 is cross-coupled, transistors 34 and 38 respectively amplify the signal on nodes 33 and 35. When the common mode level of nodes 33 and 35 is low enough, cross coupled P-channel transistors 32 and 36 begin amplifying in differential mode, further contributing to the amplification on nodes 33 and 35 and insuring full power supply voltage rail levels on nodes 33 and 35 which respectively form the outputs labeled OUTPUT and OUTPUT-bar. The timing of the assertion of signal SE in an active high form must come after an adequate differential signal has appeared on the data line pair, DL and DL-bar, and thereby also has appeared on nodes 33 and 35 through the conductivity of transistor pass gates 30 and 31, respectively.

Figure 3:
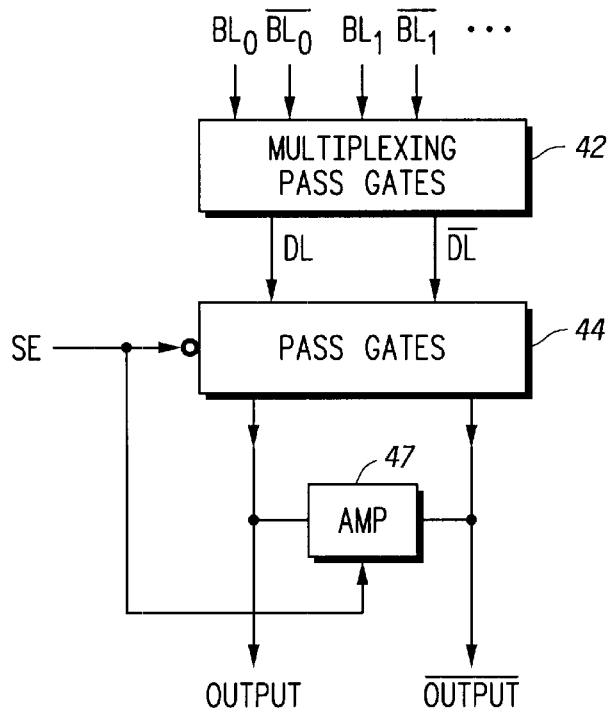
FIG. 3 illustrates in block diagram form a plan diagram of the sense amplifier of FIG. 2 using a first amplifier configuration.

Illustrated in FIG. 3 is a plan view of sense amplifier 20 of FIG. 2 using a first amplifier configuration that is equivalent to the amplifier structure of FIG. 2. In general, sense amplifier 20 may be considered to have a plurality of multiplexing pass gates 42, a plurality of pass gates 44 and an amplifier 47. The multiplexing pass gates 42 receive all of the bit lines at inputs thereof. Multiplexing pass gates 42 represent pass gates 22, 24, 26 and 28 of FIG. 2. The multiplexing pass gates 42 function to multiplex the numerous bit lines and output a single data line and its complement. It should be appreciated that multiplexing pass gates 42 may be implemented as circuitry external to a sense amplifier. The pass gates 44 are represented in FIG. 2 by transistor pass gates 30 and 31. The remaining circuitry in FIG. 2 forms amplifier 47 of FIG. 3. It should be noted that the sense enable signal SE enables the pass gates 44 while disabling the amplifier 47. Similarly, when sense enable signal SE activates amplifier 47, pass gates 44 function to disconnect amplifier 47 from the data line pair.

Figure 4:
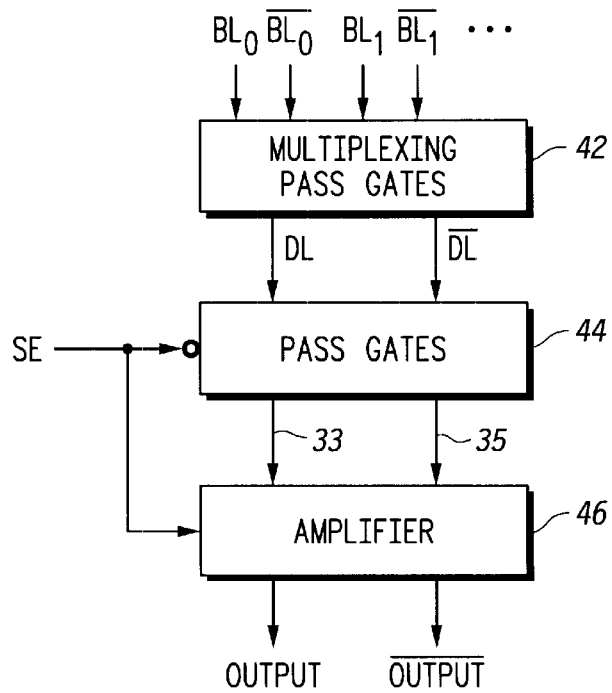
FIG. 4 illustrates in block diagram form a plan diagram of the sense amplifier of FIG. 2 using a second amplifier configuration.

Illustrated in FIG. 4 is another plan view of sense amplifier 20 of FIG. 2 using a second amplifier configuration, an amplifier 46, which differs from the amplifier structure of FIG. 2. For convenience of explanation, the same elements existing in FIGS. 2 and 3 are identically numbered. In contrast, in FIG. 4, the outputs of pass gates 44 that correspond to nodes 33 and 35 of FIG. 2 are respectively connected to first and second inputs of amplifier 46. Amplifier 46 differs from amplifier 47 of FIG. 3 in that amplifier 46 has first and second output terminals that are separate and distinct from the first and second input terminals. The first output terminal of amplifier 46 provides the true Output and the second output terminal of amplifier 46 provides the complement Output, Output-bar.

Figure 5:
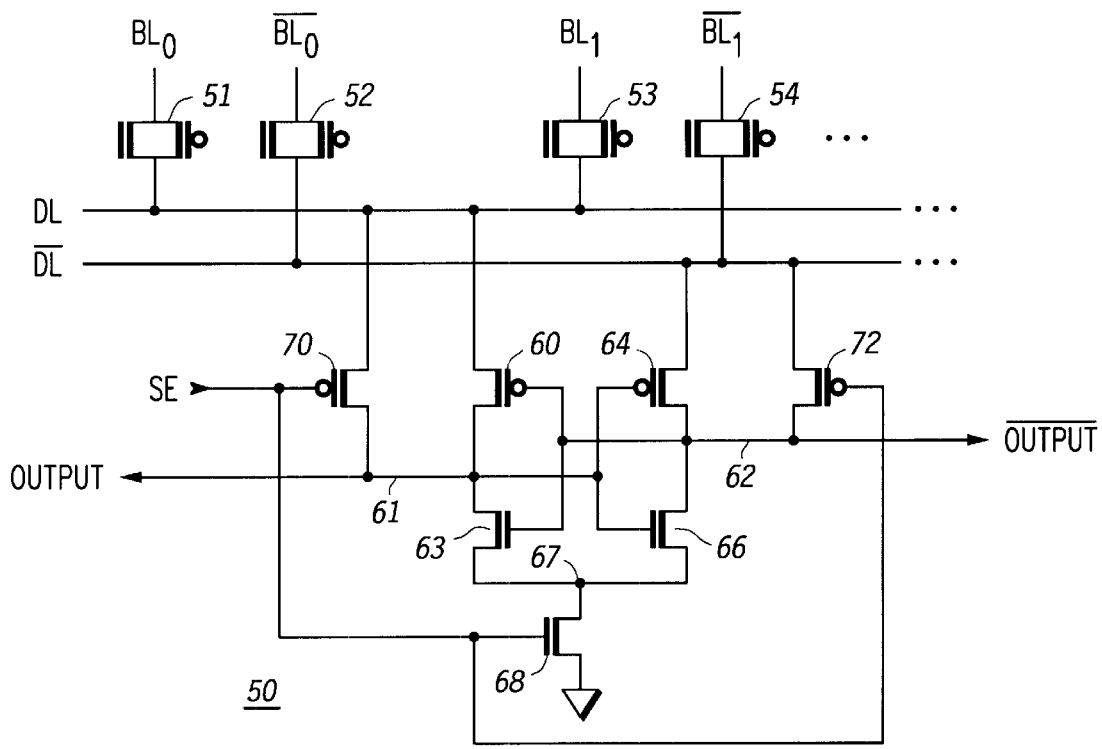
FIG. 5 illustrates in schematic diagram form another embodiment of a sense amplifier in accordance with the present invention.

Illustrated in FIG. 5 is a sense amplifier 50 forming another embodiment of the present invention. A pass gate 51 has a first terminal connected to a bit line, BL0, and a second terminal connected to a data line, DL. A pass gate 52 has a first terminal connected to a complement bit line, BL0-bar, and a second terminal connected to a complement data line, DL-bar. A pass gate 53 has a first terminal connected to a bit line, BL1, and a second terminal connected to the DL line. A pass gate 54 has a first terminal connected to a complement bit line, BL1 -bar, and a second terminal connected to the complement data line, DL-bar. Additional pass gates exist for additional columns, but are not shown for convenience. In one form, a pass gate pair exists for each column in the memory in which sense amplifier 50 is used. A source of a P-channel transistor 60 is connected to data line DL. Transistor 60 has a drain connected to a node 61 that forms an output terminal labeled "Output" and has a gate connected to a node 62 that forms a complement output terminal labeled "Output-bar". An N-channel transistor 63 has a drain connected to node 61, a gate connected to node 62, and a source connected to a node 67. A P-channel transistor 64 has a source connected to the complement data line, DL-bar, a gate connected to node 61, and a drain connected to node 62. An N-channel transistor 66 has a drain connected to node 62, a gate connected to node 61, and a source connected to node 67. An N-channel transistor 68 has a drain connected to node 67, a gate connected to a Sense Enable signal, SE, and a source connected to a ground terminal that is one terminal of a power supply. A P-channel transistor pass gate 70 has a first terminal connected to the data line, DL, a control terminal connected to the Sense Enable signal, SE, and a second terminal connected to node 61. A P-channel transistor pass gate 72 has a first terminal connected to the complement data line, DL-bar, a control terminal connected to the Sense Enable signal, SE, and a second terminal connected to node 62.

In operation, a signal from a memory cell (not shown) is applied to one of the bit line pairs, such as BL0, BL0-bar, etc. The multiplexing pass gates 51–54, etc. can be turned on either before, during or after the signal is applied to the bit line. The signal then appears on the data line pair and is transmitted through P-channel transistor pass gates 70 and 72 and arrives on nodes 61 and 62, respectively, because the sense enable signal, SE, is inactive (i.e. a logic low). When the sense enable signal SE is asserted, P-channel transistor pass gates 70 and 72 are turned off. N-channel transistor 68 is also made conductive. When N-channel transistor 68 becomes conductive, the cross-coupled pair of N-channel transistors 63, 66 begin respectively amplifying the signal on nodes 61, 62 in differential mode. When the common-mode level of nodes 61, 62 is low enough, the pair of P-channel transistors 60 and 64 begins amplifying, in differential mode, the differential signal applied to their gates. Additional amplification is obtained in the pair of P-channel transistors 60 and 64 due to the data line pair differential signal being applied to their sources in a cascode manner.

As a result, the differential gate-to-source bias (delta Vgs) on the pair of P-channel transistors 60 and 64 is twice the magnitude of the differential signal on the data line DL and complementary data line, DL-bar. Thus, the pair of P-channel transistors 60 and 64 can tolerate twice the ordinary threshold voltage offset.

Figure 6:
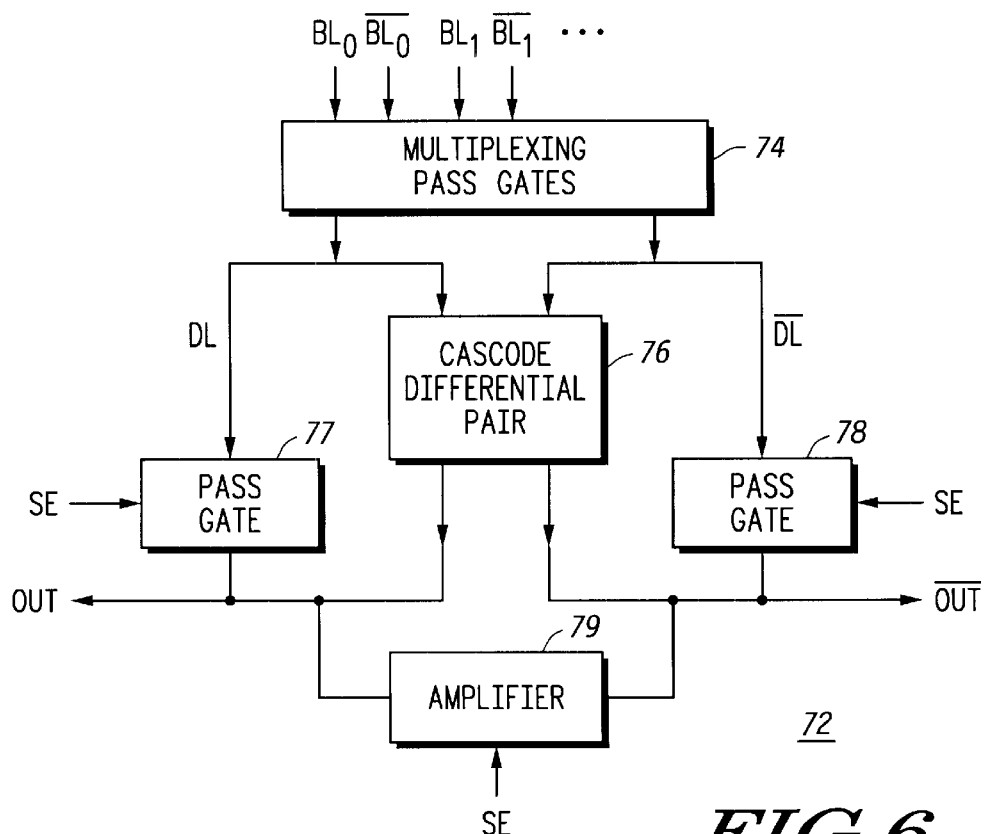
FIG. 6 illustrates in block diagram form a plan diagram of the sense amplifier of FIG. 5.

Illustrated in FIG. 6 is a plan view of sense amplifier 50 of FIG. 5 that summarizes generally sense amplifier 50. Pass gates 51–54 may be generally represented as a plurality of multiplexing pass gates 74 for receiving the various bit line pairs in true and complement form. Again, in one form, the number of bit line pairs represents a number of columns of memory cells being addressed. Pass gates 74 function to multiplex the multiple bit line pairs and output a single bit line pair as data line, DL, and the complement data line, DL-bar. Transistors 70 and 72 may respectively be represented as a pass gate 77 and a pass gate 78 that respectively receive the data line and data line-bar inputs and selectively provide the data in response to the Sense Enable signal when in logic low form. Pass gates 77 and 78 respectively provide the data to output and output-bar terminals of amplifier 79 that also function as input terminals to amplifier 79. In other words, the same terminals of amplifier 79 that are used as inputs are also used as outputs. Amplifier 79 of FIG. 6 corresponds to transistors 60, 63, 64, 66 and 68 of FIG. 5.

Figure 7:
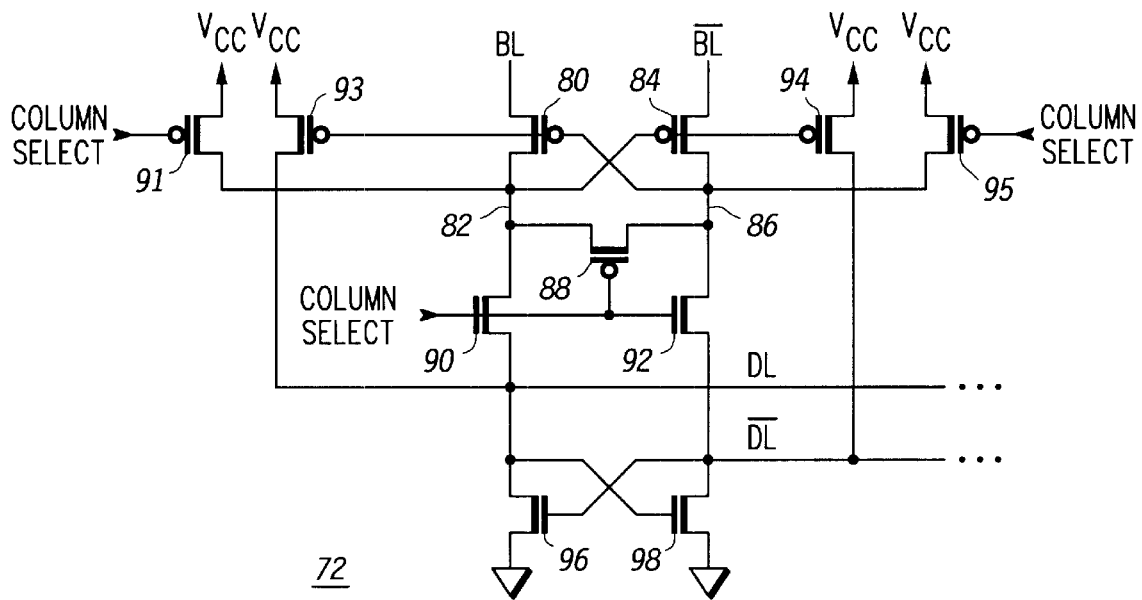
FIG. 7 illustrates in schematic diagram form yet another embodiment of the sense amplifier in accordance with the present invention.

Illustrated in FIG. 7 is a sense amplifier 72 that represents another embodiment of the present invention. A P-channel transistor 80 has a source connected to a bit line, BL, a gate connected to a node 86, and a drain connected to a node 82. A P-channel transistor 84 has a source connected to a complement bit line, BL-bar, a gate connected to node 82, and a drain connected to node 86. A P-channel transistor 88 has a source connected to node 82, a drain connected to node 86, and a gate connected to a Column Select signal. An N-channel transistor 90 has a drain connected to node 82, a gate connected to the Column Select signal, and a source connected to a data line, DL. An N-channel transistor 92 has a drain connected to node 86, a gate connected to the Column Select signal, and a source connected to a complement data line, DL-bar. A P-channel transistor 93 has a source connected to a power supply terminal for receiving a supply voltage Vcc, a gate connected to the gate of P-channel transistor 80 and node 86, and a drain connected to the data line DL. A P-channel transistor 94 has a source connected to the power supply terminal for receiving supply voltage Vcc, a gate connected to the gate of transistor 84 and node 82, and a source connected to the complement data line, DL-bar. A P-channel transistor 91 has a source connected to the power supply terminal for receiving supply voltage Vcc, a gate connected to the Column Select signal and a drain connected to node 82. A P-channel transistor 95 has a source connected to the power supply terminal for receiving supply voltage Vcc, a gate connected to the Column Select signal and a drain connected to node 86. An N-channel transistor 96 has a drain connected to the data line DL, a gate connected to the complement data line, DL-bar, and a source connected to a ground terminal. An N-channel transistor 98 has a drain connected to the complement data line, DL-bar, a gate connected to the data line, DL, and a source connected to the ground terminal.

In operation, P-channel transistors 80 and 84 function as a cascode style cross-coupled pair of transistors that are connected directly to the bit line and complement bit line. The conduction of transistors 80 and 84 is dependent upon the voltage applied to their cross-coupled gates. It should be understood that for each bit line pair, the circuitry of FIG. 7, except transistors 96 and 98, is repeated. The sources of P-channel transistors 80 and 84 receive the differential signal. P-channel transistors 91 and 95 function as precharge devices to precharge the data line and data line-bar to a ground potential. P-channel transistors 91 and 95 are made conductive and couple the Vcc supply via N-channel transistors 90 and 92 to the gates of N-channel transistors 96 and 98 making each conductive. When the Column Select signal is inactive, transistor 88 is conductive and equalizes the voltage on each of nodes 82 and 86 that equally biases transistors 80 and 84. The Column Select signal is then activated indicating that the column has been selected and making N-channel transistors 90 and 92 conductive. N-channel transistors 90 and 92 function as a coupler and provide current to the cross-coupled P-channel transistors 80 and 84. Nodes 82, 86 also provide the differential signal to P-channel transistors 93, 94 that function to actively pull-up data lines DL and DL-bar, respectively. Transistors 96 and 98 function as a cross-coupled passive latch circuit that only operates when the data lines transition in voltage. Transistors 96 and 98 are not repeated for every column of the memory since they are connected to the data line and data line-bar. By the time transistors 96 and 98 become conductive, there is sufficient differential signal on the data line and data line-bar conductors to ensure that transistors 96 and 98 will not go the wrong way due to noise or offset. In other words, if there were not sufficient differential signal on the data line, noise or offset could incorrectly make one of transistor 96 or 98 first become conductive contrary to the eventual data value. In order to make sure that this circuit condition is met, DL and DL-bar must be precharged low in any of various ways, such as by using pre-charge transistors (not shown). Once either one of transistor 96 or 98 is first strongly conductive, the other transistor becomes non-conductive and the conduction will not change regardless of the data value. However, this potential problem is averted in the design of sense amplifier 72 because the switching action ensures that there is sufficient differential signal on the data line and data line-bar before transistors 96 and 98 become conductive. Transistors 96 and 98 are "helper" devices and do not bear the critical original signal as do transistors 80 and 84. By the precharge function of transistors 91 and 95, nodes 82 and 86 are precharged to Vcc.

In another form, the drains of transistors 93, 94 may instead be connected respectively to nodes 82, 86 rather than to the data line and data line-bar. The operation is similar but there is a slightly different functional effect in the voltage at the inputs (drain) of coupler N-channel transistors 90, 92 and the data line and data line-bar.

Sense amplifier 72 drives the data line and data line-bar with both N-channel transistors 90, 92 and P-channel transistors 93, 94. There is no ohmic loss across additional pass transistors involved in the column decode function. In other words, by placing the differential bit line signal at the sources of transistors 80 and 84, the ohmic loss of passing the differential signal through a bit line/data line pass decode device is avoided. Further, sense amplifier 72 does not drain current from either bit line after sensing. Therefore, there is not a critical timing issue for turning off sense amplifier 72. Transistors 93 and 94 provide a full pull-up of the data lines DL, DL-bar, to Vcc. Sense amplifier 72 addresses speed, power and size issues without having an imbalance in any one of these design parameters with respect to the others. Typically, each of these parameters requires a circuit style that severely disadvantages the other design parameters.

Figure 8:
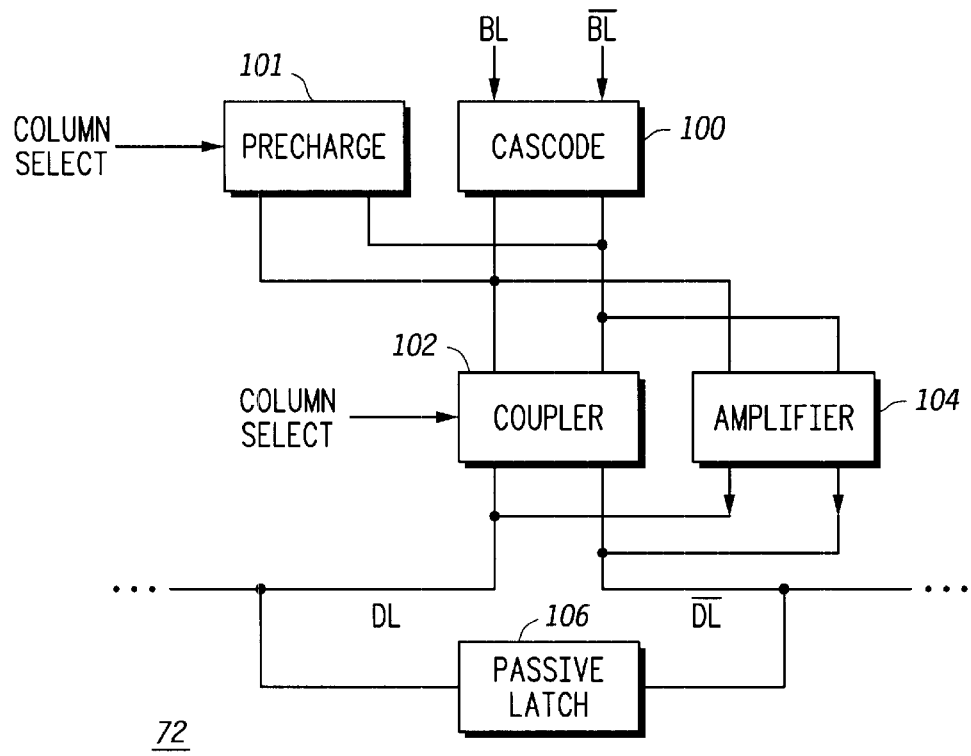
FIG. 8 illustrates in block diagram form a plan diagram of the sense amplifier of FIG. 7.

Illustrated in FIG. 8 is a plan overview of sense amplifier 72 of FIG. 6. In general, a cascode stage 100 receives a bit line pair, BL and BL-bar and has first and second outputs. A precharge portion 101 is controlled by a Column Select signal and is connected to the outputs of the cascode stage 100. An amplifier 104 has first and second inputs respectively connected to the first and second outputs of the cascode stage 100, and has first and second outputs respectively connected to the data line DL and complement data line, DL-Bar. A coupler 102 has first and second inputs respectively connected to the first and second outputs of the cascode stage 100. Coupler 102 has first and second outputs respectively connected to the data line DL and complement data line, DL-bar. A passive latch 106 is connected to the data line DL and the complement data line, DL-bar.

In comparing sense amplifier 72 with the plan overview, the cascode stage is implemented by transistors 80 and 84. The precharge portion 101 is implemented by transistors 91 and 95. The amplifier 104 is implemented by transistors 93 and 94. The coupler 102 is implemented by N-channel transistors 90 and 92, and passive latch 106 is implemented by transistors 96 and 98. It should be well understood that different circuitry than used in sense amplifier 72 may be substituted to implement the plan overview of FIG. 8. For example, various amplifier structures may be used in lieu of the specific amplifier configuration illustrated.

By now it should be appreciated that there has been provided a sense amplifier that is fast, small in size and that is efficient in power consumption. By using gain elements in the form of transistors 80, 84 that are connected to the bit line pairs prior to ohmic column selection gates, ohmic loss on the bit line is minimized. As a result, a stronger differential signal exists and this allows earlier and faster sensing to be accomplished. Additionally, the sense amplifier taught herein is able to obtain full resolution without continued current demand from the bit lines and thus power is conserved. Additionally, there are no timing critical signals associated with pass gates or the amplifier so that control circuitry is reduced and size minimized. By amplifying low-capacitance sense nodes, such as nodes 82 and 86 of FIG. 7, to a full-rail potential, the sense amplifier provided herein is much more efficient than driving either data lines or global data lines, even when partial-level signals are used to drive such data lines. The sense amplifiers taught herein combine the function of column decoding with amplification. In a preferred form, N-channel transistors are used for the column select function to couple the differential signal to the data line pair. N-channel transistors have a higher gain than P-channel transistors. P-channel transistors are then used for the amplifier function to interface between the bit lines and the sense nodes, such as nodes 82, 86 of FIG. 7.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. For example, various types of transistors, whether bipolar, MOS, GaAs or other may be used to implement the plan diagrams of the sense amplifier embodiments provided herein. Various amplifier structures may be used. Additionally, the sense amplifier may be used in various types of memories, such as SRAM, MRAM, etc. The sense amplifier may also be used with other data signals than with bit line pairs and data line pairs. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A sense amplifier comprising:

a pair of pass transistors having first and second inputs respectively connected to a data path and complementary data path for receiving a differential data signal, the pair of pass transistors respectively connecting the data path and complementary data path at first and second outputs thereof in response to a sense enable signal, the first and second inputs of the pair of pass transistors are not electrically the same as the first and second outputs thereof when the pair of pass transistors are disabled by the sense enable signal; and an amplifier having a first input connected to the first output of the pair of pass transistors, a second input connected to the second output of the pair of pass transistors, and first and second outputs for providing sense amplifier data signals in complementary form, the amplifier being controlled by the sense enable signal and being operative only when the pair of pass transistors are made nonconductive by the sense enable signal.

2. The sense amplifier of claim 1 wherein the amplifier further comprises:

a first transistor of a first conductivity type having a first current electrode connected to a first power supply terminal, a control electrode connected to the first input of the amplifier, and a second electrode connected to the second input of the amplifier;

a second transistor of a second conductivity type having a first current electrode connected to the second current electrode of the first transistor, a control electrode connected to the first input of the amplifier, and a second current electrode;

a third transistor of the first conductivity type having a first current electrode connected to the first power supply terminal, a control electrode connected to the second input of the amplifier, and a second current electrode;

a fourth transistor of the second conductivity type having a first current electrode connected to the first input of the amplifier, a current electrode connected to the second input of the amplifier, and a second current electrode connected to the second current electrode of the second transistor; and a fifth transistor of the second conductivity type having a first current electrode connected to the second current electrode of the second transistor and the second current electrode of the fourth transistor, a control electrode for receiving the sense enable signal, and a second current electrode connected to a second power supply terminal.

3. The sense amplifier of claim 1 wherein the amplifier further comprises:

a first transistor of a first conductivity type having a first current electrode connected to the data path, a second current electrode connected to the first output, and a control electrode connected to the second output;

a second transistor of a second conductivity type having a first current electrode connected to the second current electrode of the first transistor, a second current electrode, and a control electrode connected to the control electrode of the first transistor;

a third transistor of the first conductivity type having a first current electrode connected to the complementary data path, a second current electrode connected to the second output, and a control electrode connected to first output;

a fourth transistor of the second conductivity type having a first current electrode connected to the second current electrode of the third transistor, a second current electrode connected to the second current electrode of the second transistor, and a control electrode connected to the first output; and a fifth transistor of the second conductivity type having a first current electrode connected to the second current electrode of both the second transistor and the fourth transistor, a control electrode for receiving the sense enable signal, and a second current electrode connected to a power supply terminal.

4. The sense amplifier of claim 1 further comprising:

a plurality of transistor pass gate pairs, each of the plurality of transistor pass gate pairs having first and second inputs respectively connected to a predetermined bit line and complementary bit line pair of a memory and first and second outputs respectively connected to a memory data path and complementary memory data path.

5. The sense amplifier of claim 4 wherein the plurality of transistor pass gate pairs equals a number of columns in the memory.

6. The sense amplifier of claim 1 wherein the data path is a memory bit line.

7. The sense amplifier of claim 1 wherein the data path is a memory data line.

8. A sense amplifier comprising:

a pair of pass transistors having first and second inputs respectively connected to a data path and complementary data path for receiving a differential data signal, the pair of pass transistors respectively connecting the data path and complementary data path at first and second outputs thereof in response to a sense enable signal; and an amplifier having a first input connected to the first output of the pair of pass transistors, a second input connected to the second output of the pair of pass transistors, and first and second outputs for providing sense amplifier data signals in complementary form, the amplifier being controlled by the sense enable signal and being operative only when the pair of pass transistors are made nonconductive by the sense enable signal, wherein the first output and the second output of the amplifier are electrically the same as the first input and the second input of the amplifier, respectively.

9. A sense amplifier comprising:

a cascode stage having a first input connected to a first data path, a second input connected to a first complementary data path, an output connected to a second data path, and a complementary output connected to a second complementary data path;

a coupler having a first pair of current electrodes connected to the second data path and second complementary data path, a control electrode, and a second pair of current electrodes connected to a third data path and a third complementary data path; and a latch having a first input connected to the third data path, a second input connected to the third complementary data path, a control input connected to the third data path a complementary control input connected to the third complementary data path.

10. The sense amplifier of claim 9 further comprising:

an amplifier having a true input connected to the second data path, a complement input connected to the second complementary data path, a true output connected to a third data path, and a complement output connected to the third complementary data path.

11. The sense amplifier of claim 9 further comprising:

a precharge means connected to the second data path and the second complementary data path for selectively biasing the cascode stage in a nonconductive state in response to a control signal to thereby electrically isolate the first data path and the first complementary data path from the sense amplifier.

12. The sense amplifier of claim 9, wherein the cascode stage further comprises:

a cascode pair of transistors having a first transistor of a first conductivity type having a first current electrode connected to a first data path, a control electrode, and a second current electrode connected to a second data path, and having a second transistor of the first conductivity type having a first current electrode connected to a first complementary data path, a control electrode connected to the second current electrode of the first transistor, and a second current electrode connected to the control electrode of the first transistor and to a second complementary data path.

13. A method of sensing a differential signal on a pair of input conductors, comprising:

receiving the differential signal;

using a pair of pass transistors to connect the pair of input conductors to a first output and a second output in response to a sense enable signal, a first of the pair of pass transistors having an input connected to a first signal of the differential signal and electrically connecting the first signal to the first output in response to the sense enable signal, a second of the pair of pass transistors having an input connected to a second signal of the differential signal and electrically connecting the second signal to the second output in response to the sense enable signal; and coupling a first input of an amplifier to the first output and coupling a second input of the amplifier to the second output, and coupling first and second outputs of the amplifier to a data line pair of conductors, the amplifier being controlled by the sense enable signal and being operative only when the pair of pass transistors are made nonconductive by the sense enable signal.

14. A sense amplifier comprising:

a first transistor of a first conductivity type having a first current electrode connected to a bit line, a control electrode, and a second current electrode;

a second transistor of the first conductivity type having a first current electrode connected to a complement of the bit line, a control electrode connected to the second current electrode of the first transistor, and a second current electrode connected to the control electrode of the first transistor;

a third transistor of a second conductivity type having a first current electrode connected to the second current electrode of the first transistor, a control electrode for receiving a column select signal, and a second current electrode for providing a first output of the sense amplifier;

a fourth transistor of the second conductivity type having a first current electrode connected to the second current electrode of the second transistor, a control electrode for receiving the column select signal, and a second current electrode for providing a second output of the sense amplifier;

a fifth transistor of the second conductivity type having a first current electrode connected to the second current electrode of the third transistor, a control electrode connected to the second current electrode of the fourth transistor, and a second current electrode connected to a reference voltage terminal; and a sixth transistor of the second conductivity type having a first current electrode connected to the second current electrode of the fourth transistor, a control electrode connected to the second current electrode of the third transistor, and a second current electrode connected to the reference voltage terminal.

15. The sense amplifier of claim 14 further comprising:

a seventh transistor of the first conductivity type having a first current electrode connected to a second reference voltage terminal, a control electrode connected to the control electrode of the first transistor, and a second current electrode connected to the second current electrode of the third transistor; and an eighth transistor of the first conductivity type having a first current electrode connected to the second reference voltage terminal, a control electrode connected to the control electrode of the second transistor, and a second current electrode connected to the second current electrode of the fourth transistor, the seventh transistor and the eighth transistor selectively amplifying the first output and the second output of the sense amplifier.

16. The sense amplifier of claim 15 further comprising:

a precharge means connected to the control electrode of each of the first transistor and the second transistor for selectively biasing the first transistor and the second transistor in a nonconductive state in response to the column select signal to thereby electrically isolate the bit line and the complement bit line from the sense amplifier.

17. The sense amplifier of claim 16 further comprising:

an equalization transistor of the first conductivity type having a first current electrode connected to the second current electrode of the first transistor, a second current electrode connected to the second current electrode of the second transistor, and a control electrode connected to the column select signal.

* * * * *